(12) United States Patent
Kang et al.

(10) Patent No.: US 7,189,425 B2
(45) Date of Patent: Mar. 13, 2007

(54) METHOD OF MANUFACTURING A SUPERCONDUCTING MAGNESIUM DIBORIDE THIN FILM

(75) Inventors: Won nam Kang, Pohang (KR); Sung-ik Lee, Pohang (KR); Eun-mi Choi, Pohang (KR); Hyeong-jin Kim, Pohang (KR)

(73) Assignee: Pohang University of Science and Technology Foundation, Pohang (KR)

( * ) Notice: Subject to any disclaimer, the term of this patent is extended or adjusted under 35 U.S.C. 154(b) by 0 days.

(21) Appl. No.: 10/781,644

(22) Filed: Feb. 20, 2004

(65) Prior Publication Data

US 2004/0186023 A1    Sep. 23, 2004

Related U.S. Application Data

(63) Continuation of application No. 10/097,975, filed on Mar. 15, 2002, now abandoned.

(30) Foreign Application Priority Data

Mar. 19, 2001  (KR) ............................... 2001-14042

(51) Int. Cl.
   *B05D 5/12*  (2006.01)
   *C23C 14/00* (2006.01)
   *C23C 16/00* (2006.01)
   *H01L 39/24* (2006.01)

(52) U.S. Cl. ................... 427/62; 427/255.38; 427/566; 427/585; 29/599; 204/192.24

(58) Field of Classification Search ................. 427/62, 427/255.38, 566, 585; 29/599; 204/192.24; 505/300, 473, 475

See application file for complete search history.

(56) References Cited

U.S. PATENT DOCUMENTS 6,511,943 B1    1/2003  Serquis et al.
6,514,557 B2 *  2/2003  Finnemore et al. ........... 427/62

(Continued)

FOREIGN PATENT DOCUMENTS

WO    WO 02/064859 A2    8/2002

OTHER PUBLICATIONS

Shinde et al. "Superconducting MgB2 thin films by pulsed laser deposition", Applied Physics Letters, vol. 79, No. 2, pp. 227-22.*

(Continued)

*Primary Examiner*—Brian K. Talbot
(74) *Attorney, Agent, or Firm*—Rothwell Figg Ernst & Manbeck

(57) ABSTRACT

A superconducting magnesium diboride ($MgB_2$) thin film having c-axial orientation and a method and apparatus for fabricating the same are provided. The fabrication method includes forming a boron thin film on a substrate and thermally processing the substrate on which the boron thin film is formed along with a magnesium source and cooling the resulting structure. The superconducting magnesium diboride thin film can be used in a variety of electronic devices employing superconducting thin films, such as precision medical diagnosis equipment using superconducting quantum interface devices (SQUIDs) capable of sensing weak magnetic fields, microwave communications equipment used for satellite communications, and Josephson devices. Computer systems with 100 times greater computing speed can be implemented with the superconducting magnesium diboride thin film.

8 Claims, 2 Drawing Sheets

U.S. PATENT DOCUMENTS

| | | | |
|---|---|---|---|
| 6,878,420 B2* | 4/2005 | Cheong et al. | 427/561 |
| 7,018,954 B2* | 3/2006 | Thieme et al. | 505/430 |
| 2002/0127437 A1 | 9/2002 | Cheong et al. | |

OTHER PUBLICATIONS

He et al., "Reactivity of MgB2 with common substarte and electronic materials", Applied Physics Letters, vol. 80, No. 2, pp. 291-293.*

Lee et al., "Synthesis of Uniformly Distributed Carbon Nanotubes on a Large Area of Si Substrates by Thermal Chemical Vapor Deposition," Applied Physics Letter, Sep. 20, 1999, vol. 75, No. 12, pp. 1721-1723.

Kang, W. et al., Epitaxial MgB2 Superconducting thin films with a transition temperature of 39 Kelvin, *Science*, 292, 1521 (Mar. 8, 2001); http://lanl.arxiv.org/abs/cond-mat/0103179.

Kang, W. et al., Epitaxial MgB2 Superconducting Thin Films with a Transition Temperature of 39 Kelvin, pp. 1-3 (Mar. 9, 2001) (a copy of web pre-print at http://lanl.arxiv.org/abs/cond-mat/0103179).

Kang, W. et al., Epitaxial MgB2 Superconducting Thin Films with a Transition Temperature of 39 Kelvin, Los Alamos National Laboratory, Preprint Archive, Condensed Matter (Mar. 9, 2001) (an STN search result from the Japanese Patent Office).

* cited by examiner

METHOD OF MANUFACTURING A SUPERCONDUCTING MAGNESIUM DIBORIDE THIN FILM

CROSS-REFERENCE TO RELATED APPLICATION

This application is a continuation of U.S. application Ser. No. 10/097,975, filed Mar. 15, 2002, now abandoned the disclosure of which is incorporated herein by reference.

BACKGROUND OF THE INVENTION

1. Field of the Invention

The present invention relates to a method and apparatus for fabricating a superconducting magnesium diboride ($MgB_2$), and more particularly, to a superconducting magnesium diboride thin film having c-axial orientation and high temperature superconductivity, and method and apparatus for fabricating the superconducting magnesium diboride thin film.

2. Description of the Related Art

Recently, a research report on superconductivity in magnesium diboride $MgB_2$ in Nature 410, p. 63, Mar. 1, 2001 by Nagamatsu et al. discloses superconducting magnesium diboride having a transition temperature as high as 39 K, compared to the transition temperature of 23 K for conventional superconducting metals. The magnesium diboride also has high current transporting capability due to higher conduction-electron density. Thus, it is highly probable that almost all existing conventional superconducting materials will be replaced with the magnesium diboride superconductor.

Such highly probable applicability of the superconducting magnesium diboride has boosted recent research on superconducting magnesium diboride worldwide. As an example, Canfield et al. at the Iowa State Univ. in the U.S. developed superconducting wires for practical uses (Phys. Rev., Lett. 86, 2423 (2001)).

In addition, processing of superconducting magnesium diboride into a thin film is essential for its application in a variety of electronic devices. However, there have not yet been any reports of superconducting magnesium diboride in the form of thin film with satisfactory effects.

SUMMARY OF THE INVENTION

It is a first object of the present invention to provide a method for fabricating a superconducting magnesium diboride ($MgB_2$) thin film.

It is a second object of the present invention to provide a superconducting magnesium diboride thin film formed by the method.

It is a third object of the present invention to provide an apparatus for fabricating a superconducting magnesium diboride thin film.

To achieve the first object of the present invention, there is provided a method for forming a superconducting magnesium diboride ($MgB_2$) thin film, the method comprising: (a) forming a boron thin film on a substrate; and (b) thermally processing the substrate on which the boron thin film is formed along with a magnesium source and cooling the resulting structure.

It is preferable that, in step (a), the boron thin film is formed by pulsed laser deposition, sputtering deposition, electron beam evaporation, metallorganic chemical vapor deposition, or chemical vapor deposition.

It is preferable that, in step (b), the substrate with the boron thin film and the magnesium source are heated at a temperature of 600–1000° C. in the absence of any reactive gas such as air.

It is preferable that step (b) is carried out in a state where the substrate with the boron thin film and the magnesium source are double sealed with a container made of tantalum or niobium inside and a container made of quartz outside. As a result, a magnesium diboride thin film having good superconductivity can be obtained.

It is preferable that both ends of the container made of tantalum or niobium are sealed in an inert gas atmosphere, and both ends of the container made of quartz are sealed in a vacuum. In step (b), the temperature of the heat source is raised to 600–1000° C., and the substrate with the boron thin film and the magnesium source are placed inside the heat source, rapidly heated at the temperature of 600–1000° C. for 10–60 minutes, and cooled in the heat source to room temperature.

The second object of the present invention is achieved by a superconducting magnesium diboride thin film formed by the method of claim 1 with the c-axial crystal orientation.

The third object of the present invention is achieved by an apparatus for fabricating a superconducting magnesium diboride thin film, the apparatus comprising: a first protecting member receiving a substrate with a magnesium diboride thin film and a magnesium source for preventing the magnesium diboride thin film and the magnesium source from oxidizing in contact with the air; a second protecting member receiving the first protecting member for preventing oxidization of the first protecting member; and a heat source for thermally processing the substrate with the boron thin film and the magnesium source contained in the first protecting member and the second protecting member.

It is preferable that the substrate with the boron thin film is a monocrystalline sapphire substrate or a monocrystalline strontium titanate substrate. Use of these substrates can suppress unnecessary reactions between the boron thin film and the substrate at high temperatures. Preferably, the first protecting member is formed of tantalum or niobium and is filled with an inert gas. Filling the first protecting member with an inert gas is effective in preventing oxidation of the boron thin film and the magnesium source. It is preferable that the second protecting member is formed of quartz and its inside is in a vacuum state. Evacuating the second protecting member can effectively prevent oxidation of the first protecting member by contact with the air.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

A method for fabricating a magnesium diboride ($MgB_2$) thin film according to the present invention roughly involves two steps: Step 1 of forming a boron thin film as a precursor of magnesium diboride using a physical deposition apparatus, and Step 2 of forming a superconducting magnesium diboride thin film by diffusing magnesium into the boron thin film through reaction with magnesium.

In Step 1, the formation of the boron thin film can be achieved by pulsed laser deposition (PLD), sputtering deposition, electron beam evaporation, metallorganic chemical vapor deposition (MOCVD), chemical vapor deposition, etc. The boron thin film formed by these methods can be amorphous or crystalline. The characteristics of the boron thin film vary slightly with the method applied to form the same.

Figure 1:
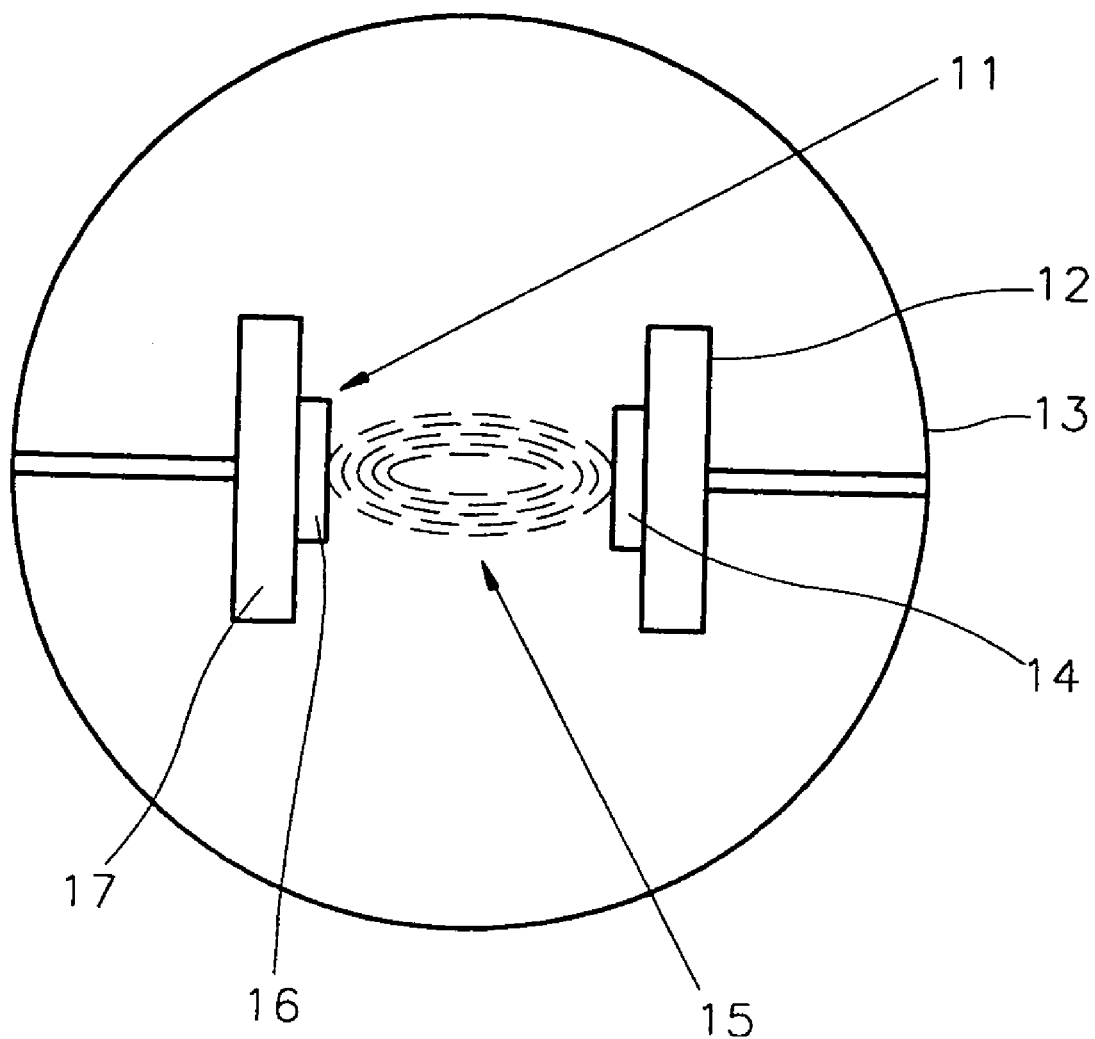
FIG. 1 shows the structure of a preferred embodiment of a pulsed laser deposition (PLD) apparatus used in the formation of a boron thin film according to the present invention.

Step 1 of forming a boron thin film by PLD will be described in greater detail with reference to FIG. 1. A coin-like target 16 for use in the deposition of the boron thin film was prepared by stuffing a cylindrical mold (having a diameter of 10–100 mm) with boron powder having a grain diameter of 1–5 µm and applying pressure on the order of 5–10 tons. The target 16 is fixed to a support plate for the target 17 and irradiated with an excimer laser beam. As a result, boron evaporates from the target 16 and forms a boron thin film on a substrate 14 fixed to the top of a support plate 12 for substrate. In FIG. 1, reference numeral 11 denotes a direction in which the laser beam is radiated, and reference numeral 15 denotes boron evaporation toward the substrate 14.

The boron deposition is carried out under the conditions of a laser pulse frequency of 1–10 Hz, preferably about 8 Hz, and a laser beam energy density of 20–30J/cm$^2$ in consideration of boron's vaporizing temperature. When boron deposition is continued for about 1–2 hours under the above conditions, an amorphous boron thin film having a thickness of about 0.5–1 µm and a mirror-like glossy surface is obtained.

The substrate 14 on which the boron thin film is formed may be a monocrystalline sapphire (a variant from corundum ($Al2O_3$)) substrate or a monocrystalline strontium titanate ($SrTiO_3$) substrate. This is because these substrates are chemically stable at high temperatures so that reaction between substrate and thin film can effectively be suppressed.

In Step 2, a superconducting magnesium diboride thin film is formed by diffusing magnesium into the boron thin film through a thermal process to grow magnesium diboride crystal having uniform orientation.

Magnesium is easy to oxidize and has a melting temperature of 650° C. and a vaporizing temperature of 1107° C., which are much lower than the melting point of 2100° C. and vaporizing temperature of 4000° C. of boron. Magnesium needs high-pressure reaction conditions due to its poor reactivity at atmospheric pressure. Magnesium also has higher vapor pressure at a high temperature, and thus heating magnesium in a sealed container can create a high-pressure environment. Based upon these characteristics of magnesium, the boron thin film is reacted with magnesium under continuous high-pressure. This process will be described in greater detail with reference to FIG. 2.

Once a boron thin film 20 is formed on a substrate 21 as in Step 1, the substrate 23 with the boron thin film 20 and a magnesium source 22 are placed in a first protecting member 24 and then in a second protecting member 25. The magnesium source 22 may be provided in any form, for example, powder, ribbon, or turning form, but the turning form is preferred because it has less surface area than the other forms so that a chance of impurity contamination occurring is reduced.

Figure 2:
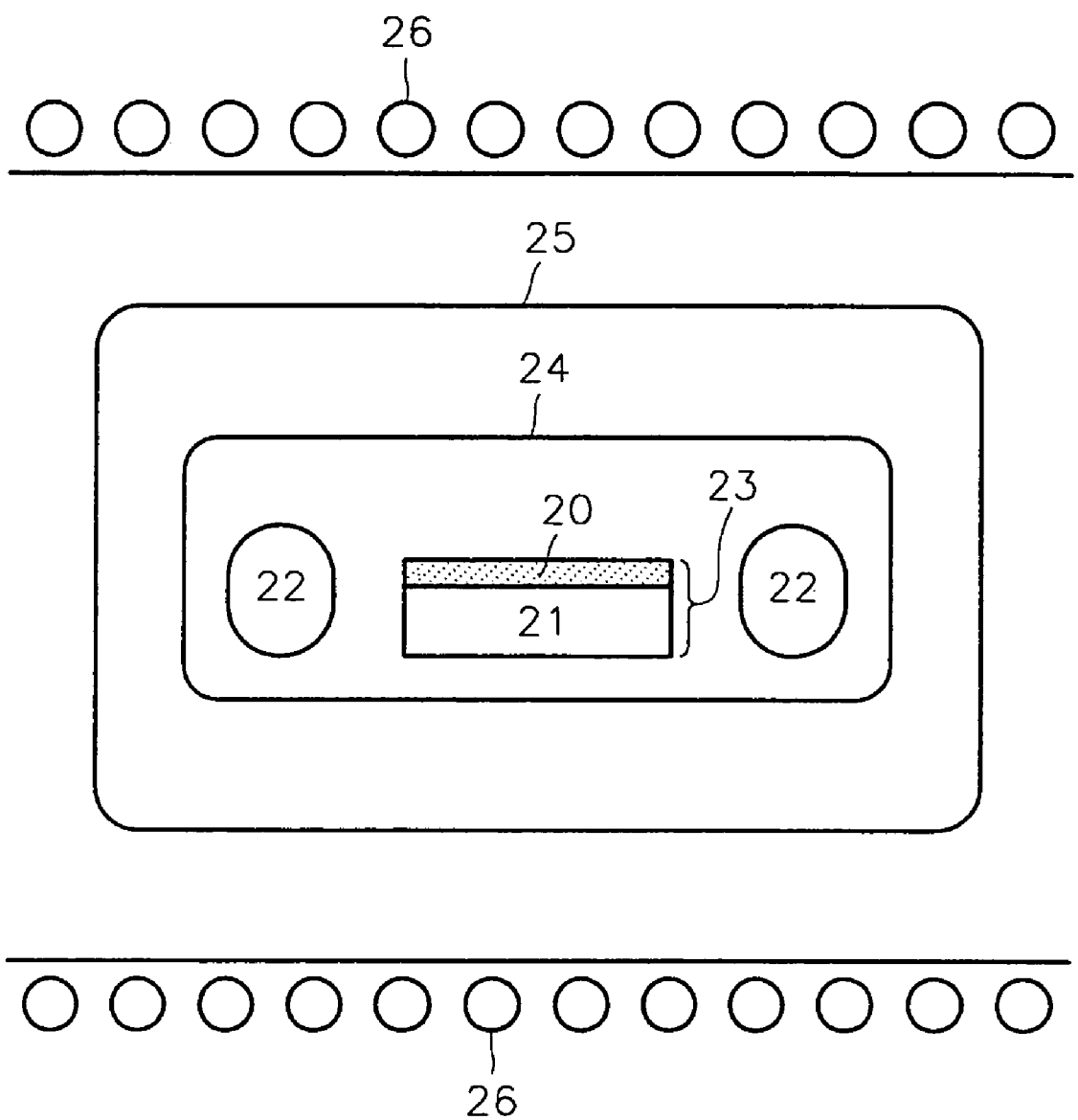
FIG. 2 shows the structure of an apparatus for thermally processing a superconducting magnesium diboride thin film according to the present invention.

Next, the second protecting member 25 is heated by a heat source 26 and cooled, thereby resulting in a desired superconducting magnesium boride thin film. An example of the heat source 26, a horizontal type electric furnace, is shown in FIG. 2.

It is preferable that the boron thin film 20 and the magnesium source 22 are heated at a temperature of 600–1000° C. If the heating temperature of the boron thin film 20 and the magnesium source 22 is less than 600° C., magnesium diffusion into the boron thin film 20 hardly occurs. If the heating temperature exceeds 1000° C., unintended crystalline structure is formed. The heat source 26 is not limited to the type of FIG. 2, and a vertical or box type electric furnace can be used as the heat source 26.

Preferably, the thermal process is carried out in a short time. In particular, the temperature of the heat source 26 is raised to 600–1000° C., and a sample is moved to a uniform-temperature center region of the heat source 26 within 30 minutes, preferably in 5 minutes. The sample is heated at the temperature of 600–1000° C. for 2 hours, preferably 30 minutes, drawn out of the heat source 26, and cooled for 30 minutes to 2 hours, preferably 1 hour. Such a rapid thermal process can effectively prevent degradation of the magnesium diboride thin film which would be caused by chemical reaction with the substrate underlying the magnesium diboride thin film.

The first protecting member 24 is for preventing the boron thin film 20 and the magnesium source 22 from oxidizing, and thus it is preferable that the first protecting member 24 is formed of a material incapable of causing chemical reaction with the magnesium source 22 at high temperatures. Suitable materials for the first protecting member 24 include tantalum (Ta) and niobium (Nb). It is preferable that the first protecting member 24 is filled with an inert gas such as argon (Ar) to prevent oxidation of the boron thin film 20 and the magnesium source 22. In particular, magnesium changes into magnesium oxide by combination with oxygen present in the air. Thus, the sample should be reacted with magnesium in the absence of oxygen to grow high-purity magnesium boride crystals. The first protecting member 24 can be manufactured in any shape without limitations. In an embodiment of the present invention, as the first protecting member 24, a container made of Ta, more specifically a Ta tube whose ends are sealed, is used.

The second protecting member 25 is for protecting the first protecting member 24 from oxidizing at high temperatures by contact with the air, and it is not limited in shape. In an embodiment of the present invention, as the second protecting member 24, a container made of quartz, and preferably a quartz tube whose both ends are sealed, is used. The inside of the second protecting member 25 is evacuated to protect the first protecting member 24 from oxidizing in contact with the air.

A result of an x-ray diffraction test on the superconducting magnesium diboride thin film obtained by the method described above shows that the resultant superconducting magnesium diboride thin film has the c-axial orientation. In contrast, the magnesium diboride powder prepared by Nagamatsu et al. and the magnesium diboride wires formed by Canfield et al. are proven to be polycrystals grown in arbitrary directions without orientation in a particular direction. The magnesium diboride thin film formed by the method according to the present invention has a superconducting critical temperature of 39 K and a critical current density of 8,000,000 A/cm$^2$. The superconducting critical temperature of the magnesium diboride thin film according to the present invention is the same as that of the conventional superconducting magnesium diboride wires. However, the critical current density of the magnesium diboride thin film according to the present invention sets the highest record of 20 times greater current transporting capability than the conventional superconducting wires.

The method for forming a superconducting magnesium diboride thin film according to the present invention enables formation of a magnesium diboride thin film with good superconductivity and crystalline c-axial orientation. The superconducting magnesium diboride thin film can be used in a variety of electronic devices employing superconducting thin films, such as precision medical diagnosis equipment using superconducting quantum interface devices (SQUIDs) capable of sensing weak magnetic fields, microwave communications equipment used for satellite communications, and Josephson devices. Computer systems with 100 times greater computing speed can be implemented with the superconducting magnesium diboride thin film.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for forming a superconducting magnesium diboride ($MgB_2$) thin film, the method comprising:
    forming a boron thin film on a monocrystalline sapphire substrate or a monocrystalline strontium titanate substrate by pulsed laser deposition, sputtering deposition, electron beam evaporation, metallorganic chemical vapor deposition, or chemical vapor deposition;
    thermally processing the substrate on which the boron thin film is formed along with a magnesium source and cooling the resulting structure, the substrate having the boron thin film and the magnesium source being double sealed with a container made of tantalum or niobium on the inside and a container made of quartz on the outside;
    placing the substrate with the boron thin film and the magnesium source in a heat source having a temperature equal to or greater than 600° C. and less than 950° C.; and
    rapidly heating the substrate with the boron thin film and the magnesium source for 10–60 minutes, and then cooling the substrate, wherein both ends of the container made of tantalum or niobium are sealed in an inert gas atmosphere, and both ends of the container made of quartz are sealed in a vacuum.

2. A method for forming a superconducting magnesium diboride ($MgB_2$) thin film, the method comprising the steps of:
    forming a boron thin film on a monocrystalline sapphire substrate or a monocrystalline strontium titanate substrate by pulsed laser deposition, sputtering deposition, electron beam evaporation, metallorganic chemical vapor deposition, or chemical vapor deposition;
    placing the substrate with the boron thin film and the magnesium source in a heat source generating a temperature equal to or greater than 600° C. and less than 1000° C.; and
    heating the substrate with the boron thin film and the magnesium source for 10–60 minutes, and then cooling the substrate,
    wherein the substrate with the boron thin film and the magnesium source are contained in a container made of tantalum or niobium, and
    wherein the container made of tantalum or niobium is contained in a container made of quartz.

3. The method of claim 2, wherein the inside of the container made of tantalum or niobium is filled with an inert gas.

4. The method of claim 2, wherein the container made of tantalum or niobium is sealed in an inert gas atmosphere.

5. The method of claim 3, wherein a boron thin film is formed on a monocrystalline sapphire substrate or a monocrystalline strontium titanate substrate by pulsed laser deposition.

6. The method of claim 4, wherein a boron thin film is formed on a monocrystalline sapphire substrate or a monocrystalline strontium titanate substrate by pulsed laser deposition.

7. The method of claim 3, wherein the inside of the container made of quartz is in a vacuum state.

8. The method of claim 4, wherein the inside of the container made of quartz is in a vacuum state.

* * * * *